(12) United States Patent
Bindrup

(10) Patent No.: US 7,772,045 B1
(45) Date of Patent: Aug. 10, 2010

(54) WIRE BOND METHOD FOR ANGULARLY DISPOSED CONDUCTIVE PADS AND A DEVICE MADE FROM THE METHOD

(76) Inventor: Randy Wayne Bindrup, 22251 Parkwood St., Lake Forest, CA (US) 92630

( * ) Notice: Subject to any disclaimer, the term of this patent is extended or adjusted under 35 U.S.C. 154(b) by 49 days.

(21) Appl. No.: 11/977,447

(22) Filed: Oct. 24, 2007

Related U.S. Application Data

(60) Provisional application No. 60/853,707, filed on Oct. 24, 2006.

(51) Int. Cl.
*H01L 21/00* (2006.01)
*H01L 23/48* (2006.01)

(52) U.S. Cl. .................. 438/125; 438/617; 257/692; 257/E23.068; 257/E23.014; 257/E21.705

(58) Field of Classification Search ............. 438/104, 438/125, 617; 257/692, E21.705, E23.186, 257/E27.111, E23.014, E23.015, E23.068
See application file for complete search history.

(56) References Cited

U.S. PATENT DOCUMENTS

| | | | |
|---|---|---|---|
| 4,403,238 A | 9/1983 | Clark | |
| 4,525,921 A | 7/1985 | Carson et al. | |
| 4,672,737 A | 6/1987 | Carson et al. | |
| 5,465,899 A * | 11/1995 | Quick et al. | 228/180.5 |
| 5,701,233 A | 12/1997 | Carson et al. | |
| 6,072,234 A | 6/2000 | Camien et al. | |
| 6,201,668 B1 * | 3/2001 | Murphy | 360/294.4 |
| 6,333,562 B1 * | 12/2001 | Lin | 257/777 |
| 6,369,454 B1 * | 4/2002 | Chung | 257/787 |
| 6,967,411 B2 | 11/2005 | Eide | |
| 6,998,295 B2 * | 2/2006 | Kanda et al. | 438/110 |
| 7,174,627 B2 * | 2/2007 | Gann | 29/827 |
| 2003/0178710 A1 * | 9/2003 | Kang et al. | 257/673 |
| 2005/0201668 A1 * | 9/2005 | Neta | 385/14 |
| 2005/0205995 A1 * | 9/2005 | Ishikawa et al. | 257/738 |
| 2006/0267189 A1 * | 11/2006 | Usui et al. | 257/723 |

* cited by examiner

*Primary Examiner*—Caridad M Everhart

(57) ABSTRACT

A method and device relating the electrical interconnection of angularly disposed conductive is disclosed. Conventional wire bonding equipment is used to apply a wire ball on a first conductive surface in an electronic assembly. A conductive wire is drawn up vertically and terminated such that the central portion of the wire is proximal the second conductive surface. The electronic assembly is reoriented with respect to the travel of the capillary whereby a stitch bond is defined upon the second conductive surface to define an interconnect wire and a terminal wire portion, which terminal wire portion is removed.

40 Claims, 4 Drawing Sheets

WIRE BOND METHOD FOR ANGULARLY DISPOSED CONDUCTIVE PADS AND A DEVICE MADE FROM THE METHOD

CROSS REFERENCE TO RELATED APPLICATIONS

This application claims priority to U.S. provisional patent application No. 60/853,707, entitled "Stacked Electronic Module Wire Bond Module and Method" filed Oct. 24, 2006, which application is fully incorporated herein by reference.

BACKGROUND OF THE INVENTION

The invention generally relates to a method for the electrical connection of angularly disposed surfaces, each comprising one or more electrically conductive pads. The invention further relates to an electronic assembly fabricated from the method. The invention provides a simple and cost-effective method for interconnecting such angularly disposed, electrically conductive surfaces as is required for instance, in the interconnection of a three-dimensional, multi-layer electronic module to a printed circuit board.

There is a continuing demand for higher circuit density in a wide variety of electronic applications such as consumer electronics, space hardware, and military weaponry and hardware. To avoid the two-dimensional limitations of conventional printed circuit boards, industry has begun using high density, three-dimensional, multilayer modules comprised of individual interconnected layers of microelectronic circuitry which occupy very little surface area but provide greatly increased circuit density per given area. The individual layers in the respective modules may comprise bare integrated circuit die, encapsulated integrated circuit die such as NEO-LAYERS, modified prepackaged parts, or stacked commercial off the shelf packaged parts such as ball grid array packages.

Examples of such three-dimensional modules include those disclosed in U.S. Pat. No. 4,403,238, U.S. Pat. No. 4,525,921, U.S. Pat. No. 4,672,737, U.S. Pat. No. 5,701,233, U.S. Pat. No. 6,072,234, U.S. Pat. No. 6,967,411, U.S. Pat. No. 7,174,627, all to common assignee, Irvine Sensors Corp., the assignee of the present application Another example of using the "Z-axis" to increase circuit density is the use of a daughterboard/motherboard configuration where one or more printed circuit boards are mounted to a motherboard at an approximately perpendicular angle Required input/output and power/ground interfaces between a multi-layer module or daughterboard and a printed circuit board are presently provided in different formats including ball grid array or wire bond interfaces. Each of these methods has a measure of inefficiency due to the difficulty, time and expense associated with the design and assembly of such interfaces as well as problems with signal path length and related parasitic inductance.

Providing conductive contact pads on a lateral surface of the multilayer module or daughterboard for interconnection with the printed circuit board is desirable due to ease of assembly, reworkability and shorter lead length. There are very few simple and efficient methods for the interconnection of electronic assemblies with interconnection conductive patterns that lie in a perpendicular plane to each other.

The instant invention provides a simple, cost-effective and reliable method for the electrical interconnection of perpendicular or angularly disposed conductive surfaces using industry standard wire bonding techniques and equipment.

BRIEF SUMMARY OF THE INVENTION

The present invention discloses a method for the electrical interconnection of adjacent, angularly disposed conductive patterns such as may exist where a multilayer module with a conductive pad on a lateral surface is to be interconnected to a conductive pad on, for instance, a printed circuit board to form an electronic assembly.

The method and related assembly have particular application where the materials upon which the angularly disposed conductive surfaces are fabricated have different coefficients of thermal expansion (CTE) or different mechanical or physical properties that could cause failure in the form of an electronic "open" in the event of relative motion as the result of vibration, shock or CTE mismatch between the assembled devices (e.g., a multi-layer stack of integrated circuit die mounted on a FR-4 printed circuit board). The disclosed method creates the necessary electronic connection in the form of a stress relieved conductive path.

The method is briefly described as follows: An electronic assembly is provided having a set of angularly disposed conductive surfaces such as is found where a multi-layer electronic module is bonded to a printed circuit board substrate. A ball bond is attached to a first conductive surface such as found on the printed circuit board using an industry-standard wire bond machine having a threaded capillary and a conductive wire. The wire is drawn and cut to a predetermined length and position proximal to a second, angularly disposed conductive surface.

The second conductive surface such as is found on the lateral surface of a multi-layer electronic module, is then oriented with respect to the capillary of the wire bond machine whereby a central portion of the wire strand is "stitched", for instance by means of a stitch bond (also referred to as a wedge bond or tail bond) to the second conductive surface. The remaining electrically "open" portion of the wire or "tail" is manipulated so that it can be removed.

While the claimed apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112, are to be accorded full statutory equivalents under 35 USC 112.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE PREFERRED EMBODIMENT

Figure 1:
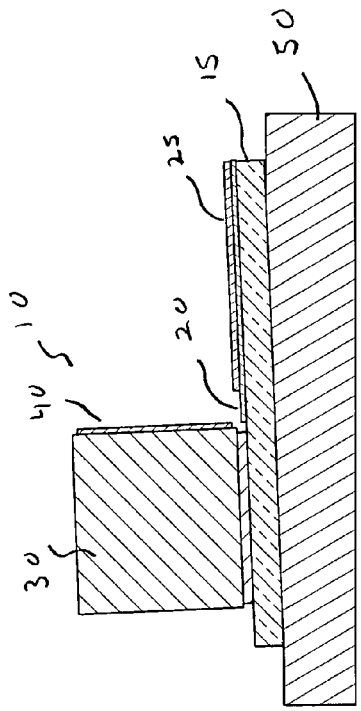
FIG. 1 is a side view of an exemplar electronic assembly comprising a three-dimensional electronic module mounted on a printed circuit board, each comprising a conductive surface.

Turning now to the figures wherein like numerals identify like elements among the several views, FIG. 1 is a preferred embodiment showing an electronic assembly 10 comprising a substrate such as a printed circuit board 15 with a first conductive surface 20. First conductive surface 20 is preferably a conductive metal pad or trace suitable for receiving a wire ball from a wire bonding machine.

Portions of first conductive surface 20 may optionally be insulated by use of a dielectric or passivation layer 25

FIG. 1 also illustrates a three-dimensional electronic module 30 mounted on printed circuit board 15, with a second conductive surface 40, preferably a conductive metal pad or trace suitable for receiving a stitch bond or wire ball bond from a wire bonding machine.

While the representative embodiment shown in FIG. 1 is intended to illustrate a three-dimensional electronic module 30 and a printed circuit board 15, it is expressly understood that the claimed invention is not limited to such structures and that the invention may be incorporated into any combination of electronic assemblies including combinations of individual electronic components, integrated circuit packages, multichip modules, bare integrated circuit die, monolithic components or assemblies such as multilayer module-to-multilayer module, printed circuit board to flex cable and the like.

Further, while the representative embodiment shown in FIG. 1 illustrates a perpendicular orientation of first conductive surface 20 with respect to second conductive surface 40, the invention is not limited to that particular angular orientation.

Figure 2:
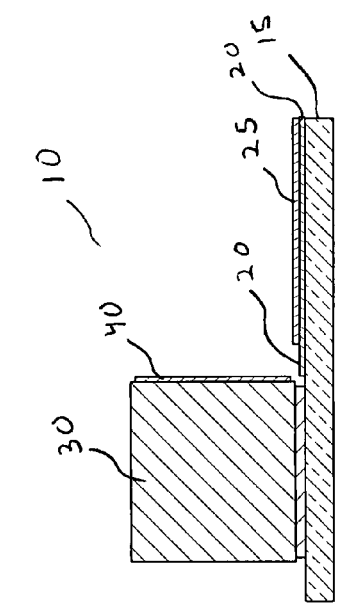
FIG. 2 is a side view of an exemplar electronic assembly comprising a three-dimensional electronic module mounted on a printed circuit board, each comprising a conductive surface mounted on a an adjustable wire bonding tooling fixture to provide an angularly adjustable wire bond stage.

As shown in FIG. 2, in the preferred embodiment, electronic assembly 10 is mounted on an adjustable wire bond fixture 50 whereby electronic assembly 10 is disposed at an angle of about 10 degrees to allow more accurate placement of the ball bond in small feature applications.

Figure 3:
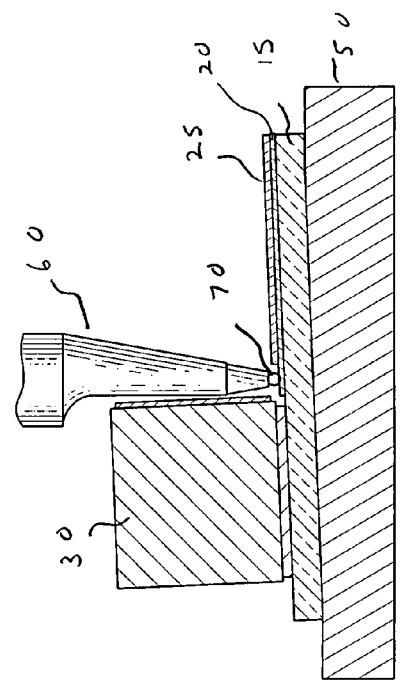
FIGS. 3 and 4 are sides view of an exemplar electronic assembly comprising a three-dimensional electronic module mounted on a printed circuit board, each comprising a conductive surface showing the placement of a wire ball bond on a first conductive surface.
Figure 4:
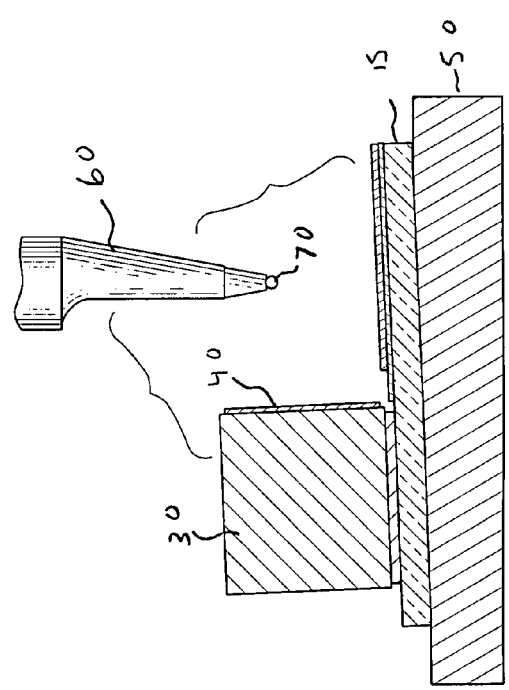

FIGS. 3 and 4 illustrate the method steps of orientation of electronic assembly 10 with respect to a threaded capillary tube 60 of a conventional wire bond machine capable of applying a first wire end 70 of a conductive wire in the form of conductive ball from a small diameter wire such as is commonly used in conventional wire bond equipment, so as to allow the attachment of first wire end 70 on first conductive surface 20.

In the preferred embodiment, a capillary with modified side relief (as shown) is used to allow easier placement of the ball on conductive surfaces that are located very close to adjacent vertical surfaces such as the vertical surface of three dimensional electronic module 30.

The wire used to form ball on first wire end 70 is preferably a gold alloy material such as gold or gold-palladium, owing to its metallurgical and physical properties, but wire materials comprising aluminum, copper or tungsten may be used where suitable.

Figure 5:
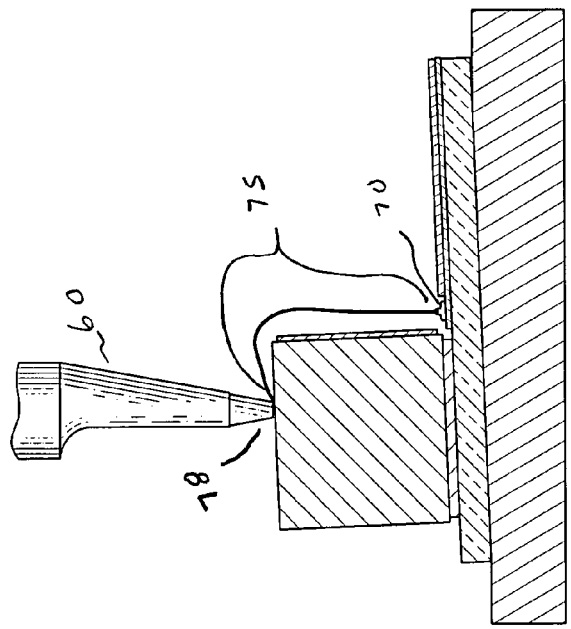
FIGS. 5-7 are sides view of an exemplar electronic assembly comprising a three-dimensional electronic module mounted on a printed circuit board, showing the drawing of a conductive wire from a threaded capillary of a wire bond machine whereby the conductive wire is cut and positioned proximal a second conductive surface.
Figure 6:
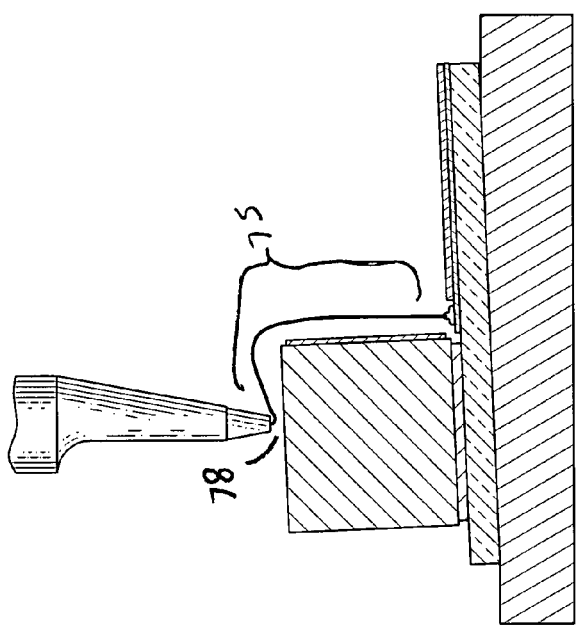
Figure 7:
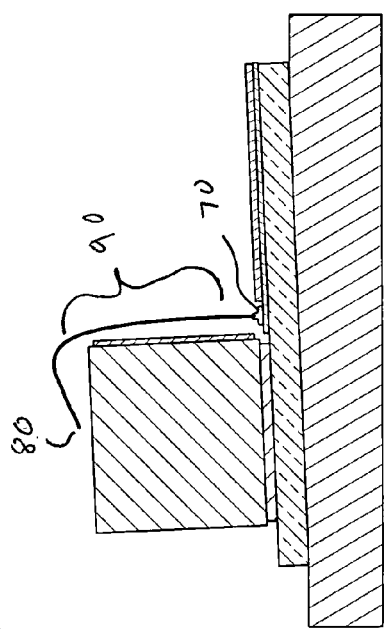

Turning to FIGS. 5-7, it can be seen that capillary tube 60 and wire 75 are drawn vertically along a lateral surface of three-dimensional electronic module 30 so as to dispose wire 75 proximal to second conductive surface 40.

Capillary tube 60 is then preferably drawn up over the surface of three-dimensional module 30 to a non-conductive location 78 and terminated to define second wire end 80 and central wire portion 90.

In the preferred embodiment of the process of the invention, the capillary function is then set to the "stitch" or wedge bond mode for the next wire bond step.

Figure 8:
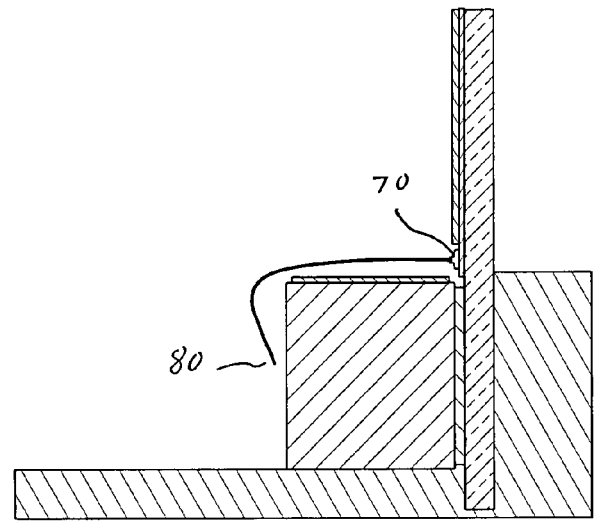
FIGS. 8-11 are side views of an exemplar electronic assembly comprising a three-dimensional electronic module mounted on a printed circuit board, showing the subsequent approximately 90 degree rotation of the assembly of FIG. 1 with respect to the threaded capillary and the fabrication of a stitch bond on the second conductive surface to define a conductive wire section and open conductive wire section.
Figure 9:
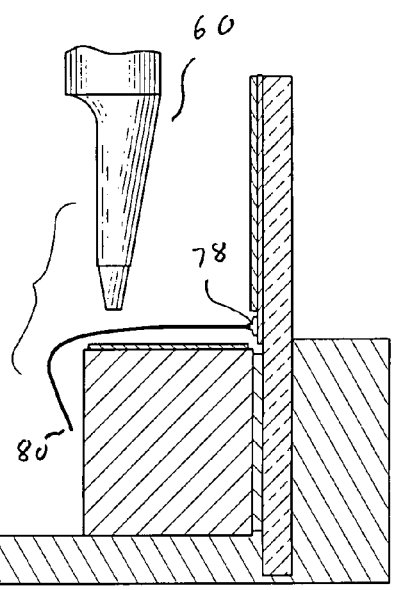

As reflected in FIGS. 8, and 9, it can be seen that electronic assembly 10 is next rotated approximately ninety degrees from the earlier steps so as to orient second conductive surface 40 approximately normal to capillary tube 60.

Figure 10:
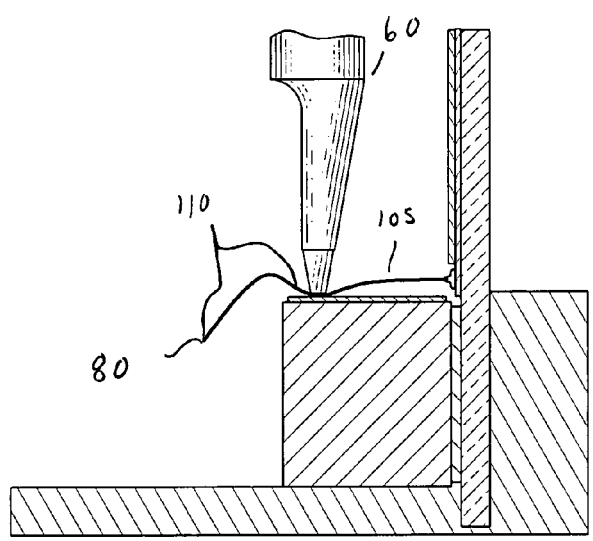
Figure 11:
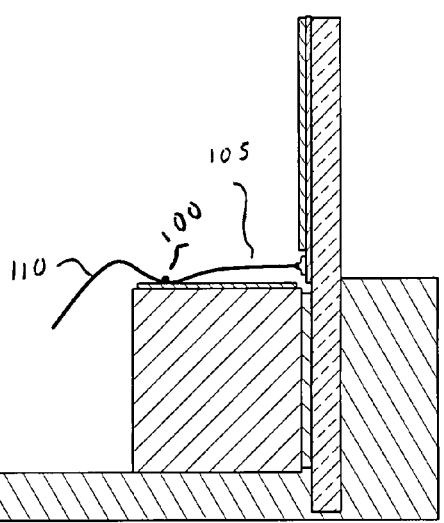

FIGS. 10 and 11 illustrate capillary tube 60 defining a stitch bond 100 at a predefined location along central wire portion 90 and in electrical connection with second conductive surface 40. The stitch bond defines an interconnect wire and 105 and further defines an unconnected, electrically open terminal wire portion 110 or "tail".

Figure 12:
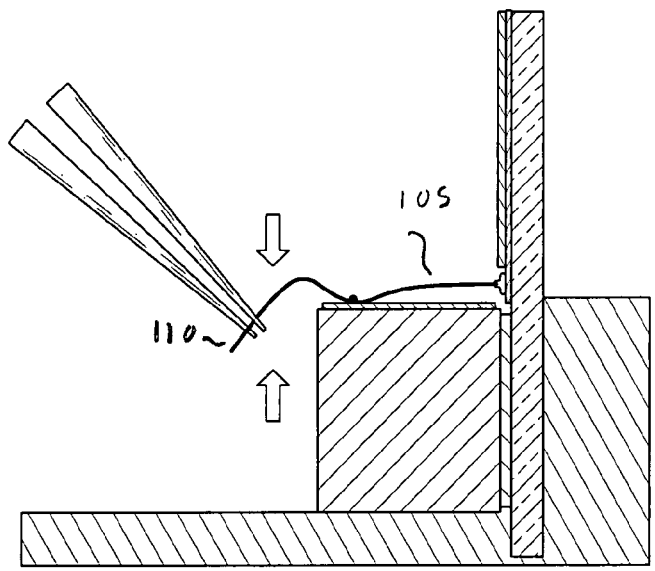
FIGS. 12-14 are sides view of an exemplar electronic assembly comprising a three-dimensional electronic module mounted on a printed circuit board, showing the subsequent approximately 90 degree rotation of the assembly of FIG. 1 and the manipulation and removal of the open conductive wire section.
Figure 13:
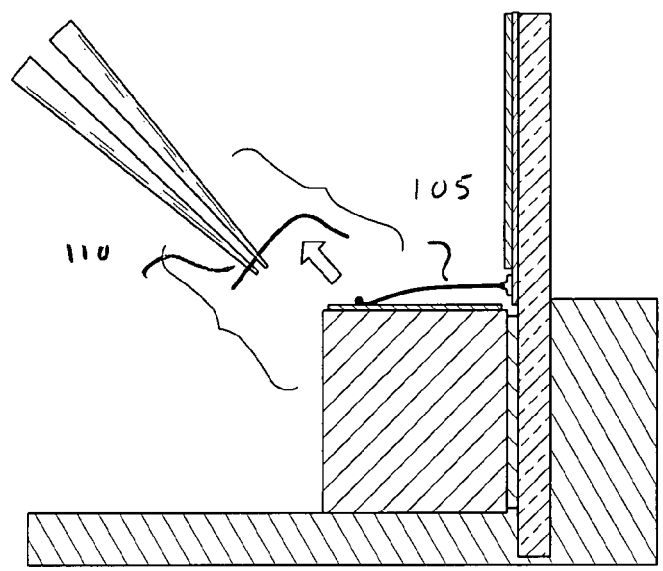

FIGS. 12 and 13 illustrate a preferred method of removing terminal wire portion 110 by means of manipulation by tweezers.

Figure 14:
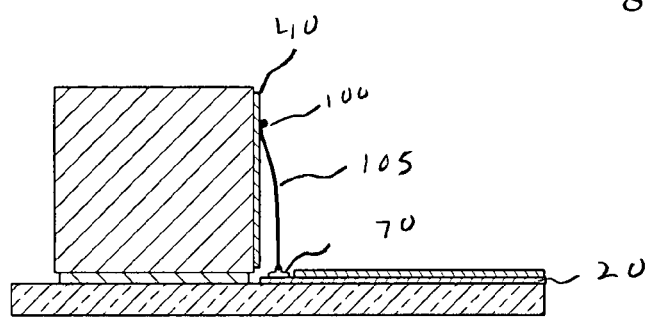

The final step of removal of terminal wire portion 110 results in an electrically connected set of angularly disposed conductive surfaces as shown in FIG. 14. The resulting assembly comprises a robust and rugged electronic device with reliable electrical connections capable of operating where there are high material property mismatches such as CTE.

Additionally, the claims below are expressly intended to encompass structures where conductive patterns exist on more than one plane such as where conductive patterns exist on multiple surfaces of a multilayer module or on two sides of a daughterboard.

Many alterations and modifications may be made by those having ordinary skill in the art without departing from the spirit and scope of the invention. Therefore, it must be understood that the illustrated embodiment has been set forth only for the purpose of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed even when not initially claimed in such combinations.

The words used in this specification to describe the invention and its various embodiments are to be understood not only in the sense of their commonly defined meanings, but to include by special definition in this specification, structure, material or acts beyond the scope of the commonly defined meanings. Thus, if an element can be understood in the context of this specification as including more than one meaning, then its use in a claim must be understood as being generic to all possible meanings supported by the specification and by the word itself.

The definitions of the words or elements of the following claims are therefore defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim.

Although elements may be described above as acting in certain combinations and even initially claimed as such, it is to be expressly understood that one or more elements from a claimed combination can, in some cases be excised from the combination and that the claimed combination may be directed to a sub combination or variation of a sub combination.

Insubstantial changes from the claimed subject matter as viewed by a person with ordinary skill in the art, now known or later devised, are expressly contemplated as being equivalent within the scope of the claims. Therefore, obvious substitutions now or later known to one with ordinary skill in the art are defined to be within the scope of the defined elements.

The claims are thus to be understood to include what is specifically illustrated and described above, what is conceptually equivalent, what can be obviously substituted and also what essentially incorporates the fundamental idea of the invention.

I claim:

1. A method for electrically connecting angularly disposed conductive surfaces, the method comprising:
   providing a first conductive surface angularly disposed to a second conductive surface, wherein the first conductive surface is located on an electronic module and the second conductive surface is located on a substrate, and wherein the electronic module is bonded to the substrate;
   providing a conductive wire having a first wire end, a second wire end, and a central wire portion between the first and second wire ends;
   electrically connecting the first wire end to the first conductive surface using a wire ball bond;
   positioning the central wire portion proximate the second conductive surface; and
   electrically connecting the central wire portion to the second conductive surface using a stitch bond to define an interconnect wire and a terminal wire portion.

2. The method of claim 1, further comprising removing at least a portion of the terminal wire portion.

3. The method of claim 1, wherein the wire comprises at least one of gold or a gold-palladium alloy.

4. The method of claim 1, wherein the wire comprises at least one of aluminum, copper, or tungsten.

5. The method of claim 1, wherein the electronic module comprises multiple layers and is mounted on a printed circuit board.

6. The method of claim 1, wherein the first conductive surface is positioned substantially perpendicular to the second conductive surface.

7. The method of claim 1, further comprising disposing the first and second conductive surfaces at an angle of about 10 degrees prior to said electrically connecting the first wire end to the first conductive surface.

8. The method of claim 1, further comprising drawing the conductive wire along a lateral surface of the electronic module.

9. The method of claim 1, wherein the electronic module comprises at least one of a bare integrated circuit die, a neo-layer, a modified pre-packaged integrated circuit die, or a pre-packaged integrated circuit die.

10. An electronic assembly having at least two angularly disposed conductive surfaces, the electronic assembly comprising:
    a first conductive surface angularly disposed to a second conductive surface, wherein the first conductive surface is located on an electronic module and the second conductive surface is located on a substrate, and wherein the electronic module is bonded to the substrate; and
    a conductive wire having a first wire end, a second wire end and a central wire portion therebetween, wherein the first wire end is electrically connected to the first conductive surface by a wire ball bond, and wherein the central wire portion is electrically connected to the second conductive surface by a stitch bond to define an interconnect wire.

11. The electronic assembly of claim 10, wherein the wire comprises at least one of gold or a gold-palladium alloy.

12. The electronic assembly of claim 10, wherein the wire comprises at least one of aluminum, copper, or tungsten.

13. The electronic assembly of claim 10, wherein the electronic module comprises multiple layers and is mounted on a printed circuit board.

14. The electronic assembly of claim 10, wherein the first conductive surface is positioned substantially perpendicular to the second conductive surface.

15. The electronic assembly of claim 10, wherein at least one of the first or second conductive surfaces is located on a lateral surface of a multi-layer electronic module.

16. The electronic assembly of claim 15, wherein the electronic module comprises at least one bare integrated circuit die.

17. The electronic assembly of claim 15, wherein the electronic module comprises at least one neo-layer.

18. The electronic assembly of claim 15, wherein the electronic module comprises at least one modified pre-packaged integrated circuit die.

19. The electronic assembly of claim 15, wherein the electronic module comprises at least one commercial off-the-shelf prepackaged integrated circuit die.

20. A method comprising:
    electrically connecting a first end of a wire to a first conductive surface of a first electronic apparatus using a wire ball bond;
    positioning at least a central portion of the wire proximate a second conductive surface of a second electronic apparatus, wherein the second conductive surface is angularly positioned with respect to the first conductive surface; and
    electrically connecting the wire to the second conductive surface of the second electronic apparatus using a stitch bond.

21. The method of claim 20, further comprising removing at least a portion of a terminal wire portion extending beyond the stitch bond.

22. The method of claim 20, wherein at least one of the first or second electronic apparatuses comprises multiple layers and is mounted on a printed circuit board.

23. The method of claim 20, wherein the first conductive surface is positioned substantially perpendicular to the second conductive surface.

24. The method of claim 20, further comprising tilting the first and second apparatuses prior to said electrically connecting a first end of a wire to a first conductive surface.

25. The method of claim 20, further comprising drawing the conductive wire along a lateral surface of at least one of the first or second electronic apparatuses.

26. An electronic assembly comprising:
a first electronic module having a first conductive surface;
a second electronic module having a second conductive surface, wherein the second conductive surface is provided at an angle with respect to the first conductive surface; and
a wire configured to electrically connect the first conductive surface and the second conductive surface, wherein the wire includes a first end electrically connected to the first conductive surface by a wire ball bond, a second end electrically connected to the second conductive surface by a stitch bond, and a central portion positioned proximate the second conductive surface.

27. The electronic assembly of claim 26, wherein at least one of the first or second electronic modules comprises multiple layers and is mounted on a printed circuit board.

28. The electronic assembly of claim 26, wherein the first conductive surface is substantially perpendicular to the second conductive surface.

29. The electronic assembly of claim 26, wherein the wire comprises at least one of gold or a gold-palladium alloy.

30. The electronic assembly of claim 26, wherein at least one of the first or second electronic modules comprises at least one of a bare integrated circuit die, a neo-layer, a modified pre-packaged integrated circuit die, or a pre-packaged integrated circuit die.

31. A method comprising:
electrically connecting a first end of a wire to a first conductive surface of a first electronic apparatus using a wire ball bond;
positioning at least a central portion of the wire proximate a second conductive surface of a second electronic apparatus, wherein the second conductive surface is angularly positioned with respect to the first conductive surface, and wherein the second electronic apparatus is a substrate bonded to the first electronic apparatus; and
electrically connecting the wire to the second conductive surface of the second electronic apparatus using a stitch bond.

32. The method of claim 31, wherein the first conductive surface is substantially perpendicular to the second conductive surface.

33. The method of claim 31, further comprising tilting the first and second conductive surfaces prior to said electrically connecting a first end of a wire to a first conductive surface.

34. The method of claim 31, further comprising drawing the conductive wire along a lateral surface of at least one of the first or second electronic apparatuses.

35. The method of claim 31, further comprising removing at least a portion of the wire extending beyond the stitch bond.

36. An electronic assembly comprising:
a first electronic apparatus having a first conductive surface;
a second electronic apparatus having a second conductive surface, wherein the second conductive surface is angularly positioned with respect to the first conductive surface, and wherein the second electronic apparatus is a substrate bonded to the first electronic apparatus; and
a wire configured to electrically connect the first conductive surface and the second conductive surface, wherein the wire includes a first end electrically connected to the first conductive surface by a wire ball bond, a second end electrically connected to the second conductive surface by a stitch bond, and a central portion located between the first and second ends and positioned proximate the second conductive surface.

37. The electronic assembly of claim 36, wherein the first electronic apparatus has multiple layers.

38. The electronic assembly of claim 36, wherein the first conductive surface is substantially perpendicular to the second conductive surface.

39. The electronic assembly of claim 36, wherein the wire comprises at least one of gold or a gold-palladium alloy.

40. The electronic assembly of claim 36, wherein the first apparatus comprises at least one of a bare integrated circuit die, a neo-layer, a modified pre-packaged integrated circuit die, or a pre-packaged integrated circuit die.

* * * * *